United States Patent [19]

Ganger et al.

[11] Patent Number: 4,857,863

[45] Date of Patent: Aug. 15, 1989

[54] LOW POWER OUTPUT DRIVER CIRCUIT WITH SLEW RATE LIMITING

[75] Inventors: Jeffrey D. Ganger, Austin; Roger A. Whatley, Georgetown, both of Tex.

[73] Assignee: Motorola, Inc., Schaumburg, Ill.

[21] Appl. No.: 236,386

[22] Filed: Aug. 25, 1988

[51] Int. Cl.[4] ........................... H03F 3/26; H03F 3/16
[52] U.S. Cl. ..................................... 330/264; 307/263
[58] Field of Search ................ 307/262, 263; 330/264, 330/277, 300, 311, 267, 268

[56] References Cited

U.S. PATENT DOCUMENTS 4,622,482 11/1986 Ganger .......................... 330/264 X Primary Examiner—Steven Mottola
Attorney, Agent, or Firm—Robert L. King

[57] ABSTRACT

A slew rate limited output driver circuit has an output terminal which varies between two power supply voltage levels in response to an input data signal. The output signal is slew rate limited by a capacitor. In order to prevent a full range of the output voltage from being placed across the capacitor, the voltage across the capacitor is limited to only one-half the full range by forcing one electrode of the capacitor to remain at a voltage potential equal to a reference voltage which, in one form, is substantially halfway between the two power supply voltages.

6 Claims, 3 Drawing Sheets

LOW POWER OUTPUT DRIVER CIRCUIT WITH SLEW RATE LIMITING

FIELD OF THE INVENTION

This invention relates generally to the field of electronic circuits, and more particularly, to driver circuits having slew rate limiting.

BACKGROUND OF THE INVENTION

Circuits are often required to limit the transition rate or slew rate of an output signal from one value to another. For example, line driver circuits which fulfill the electrical specifications of EIA Standard RS-232 or RS-422 must limit the slew rate of signal transitions in order to limit the high frequency harmonics which cause crosstalk noise in adjacent transmission channels of a data communication system. Circuits which function to reduce the edge transition of high frequency signals are well known as "slew rate limiting" circuits. A common operational amplifier technique which is used for frequency stability compensation can also be used to control the output slew rate. The technique involves using a feedback capacitor with a high gain stage to implement an integrator with a very large equivalent input capacitance known as a Miller capacitance. However, unlike an operational amplifier, line driver circuits do not have stringent analog performance requirements other than slew rate limitations.

In addition to excessive power consumption, another problem associated with capacitive slew rate limited driver circuits is related to the performance reliability of the slew rate limiting capacitor. Capacitors are commonly fabricated with thin oxide layers. Because both a positive and a negative power supply voltage are typically utilized in an operational amplifier, a voltage potential as great as the sum of the magnitudes of each power supply may develop across the slew rate limiting capacitor. When higher voltage potentials, such as the sum of two power supply magnitudes, are placed across a layer of thin oxide, the thin oxide is stressed and may be pierced and physically deteriorated. The result is a catastrophic failure of the thin oxide capacitor causing the circuit operation to also cease. Accordingly, a more reliable slew rate limit circuit is needed.

BRIEF DESCRIPTION OF THE INVENTION

Accordingly, it is an object of the present invention to provide an improved slew rate limited output driver circuit.

It is another object of the present invention to provide an improved output driver circuit which minimizes voltage drops across a slew rate limiting capacitor.

Yet another object of the present invention is to provide an improved method for limiting the slew rate of an output signal in a driver circuit.

In carrying out these and other objects of the invention, there is provided, in one form, a low power output driver circuit having a slew rate limited output. An output portion provides an output signal at an output terminal. The output terminal varies between first and second voltage potentials which are respectively coupled to first and second voltage terminals when the circuit is activated. The output terminal varies in voltage potential in response to first and second control signals. A capacitor has a first electrode coupled to the output terminal, and a second electrode. An input portion is coupled to the output portion and to the capacitor. The input portion receives an input data signal and provides the first and second control signals in response thereto. The input portion maintains the first electrode of the capacitor at a reference voltage substantially one-half between the first and second voltage potentials. The first and second control signals limit current source to the output terminal from the second voltage terminal when the output terminal transitions from the first voltage potential to the second voltage potential. The first and second control signals also limit current sinked from the output terminal to the first voltage terminal when the output terminal transitions from the second voltage potential to the first voltage potential. A bias voltage portion is coupled to the input portion for providing biasing of the input portion.

These and other objects, features and advantages will be more clearly understood from the following detailed description taken in conjunction with the accompanying drawings.

DETAILED DESCRIPTION OF THE INVENTION

Figure 1:
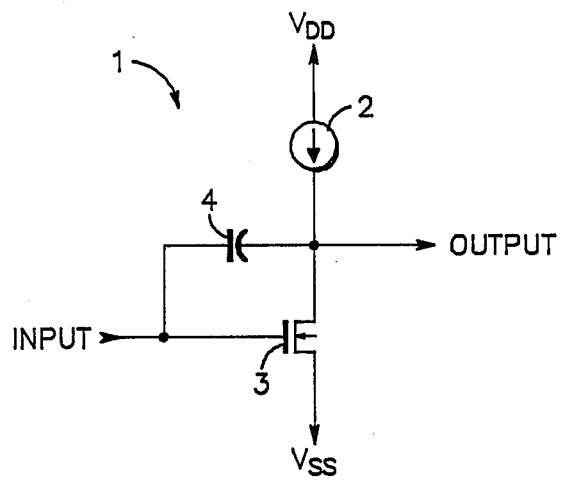
FIG. 1 illustrates in schematic diagram form a known output driver circuit.

Shown in FIG. 1 is a known output driver circuit 1 having a current source 2, an N-channel transistor 3 and a Miller frequency compensating capacitor 4. A first terminal of current source 2 is connected to a first power supply voltage labeled "$V_{DD}$". A second terminal of current source 2 is connected to a drain of transistor 3 which provides an output voltage. A gate of transistor 3 is connected to an input terminal for receiving an input signal, and a source of transistor 3 is connected to a second power supply voltage labeled "$V_{SS}$" which is less positive than $V_{DD}$. A first electrode of capacitor 4 is connected to the drain of transistor 3, and a second electrode of capacitor 4 is connected to the gate of transistor 3. Circuit 1 functions to provide an output voltage which is proportional to the input signal received by transistor 3. A disadvantage of circuit 1 is the fact that a significant voltage substantially equal to ($V_{DD}$-$V_{SS}$) may exist across capacitor 4 and damage or destroy capacitor 4 especially if capacitor 4 is a thin oxide capacitor.

Figure 2:
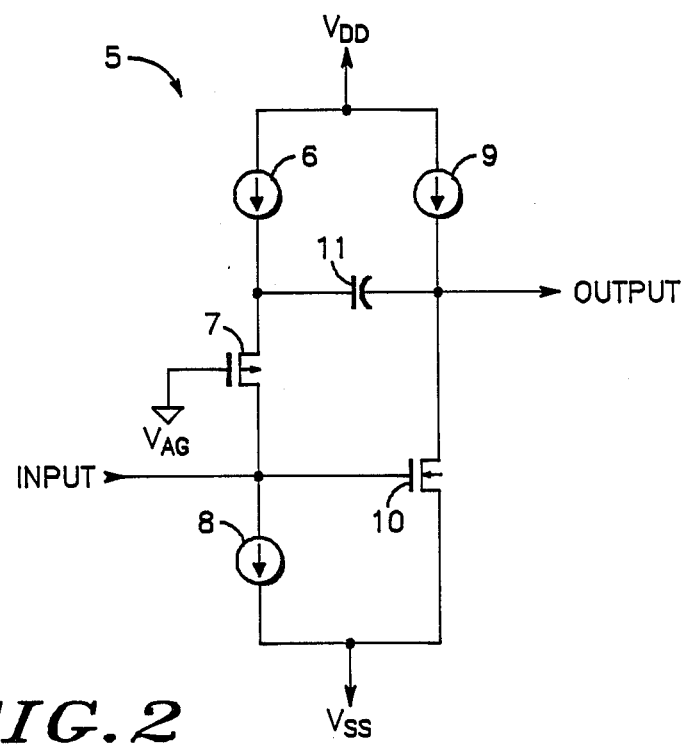
FIG. 2 illustrates in schematic diagram form a known class A cascode output driver circuit.

Shown in FIG. 2 is a known output driver circuit 5 having a current source connected to a first power supply voltage labeled "$V_{DD}$", and a second terminal connected to a source of a P-channel transistor 7. A gate of transistor 7 is connected to an analog ground terminal labeled "$V_{AG}$", and a drain of transistor 7 is connected to both an input terminal for receiving an input signal and to a first terminal of a current sink 8. A second terminal of current sink 8 is connected to a second power supply voltage labeled "$V_{SS}$" which is less positive than supply voltage $V_{DD}$. A current source 9 has a first terminal connected to $V_{DD}$, and has a second terminal connected to a drain of an N-channel transistor 10 for providing an output. A gate of transistor 10 is connected to the input terminal at the drain of transistor 7, and a source of transistor 10 is connected to supply voltage $V_{SS}$. A first electrode of a Miller frequency compensation capacitor 11 is connected to the second terminal of current source 6, and a second electrode of capacitor 11 is connected to the second terminal of current source 9.

Circuit 5 functions by operating in a class A mode of operation. Circuit 5 uses cascode feedback compensation. Transistor 7 functions as a cascode transistor having a source connected to the first electrode of capacitor 11. In class A operation, current source 6 is providing the same amount of current which current sink 8 is sinking. The voltage at the first electrode of capacitor 11 can be established and maintained by establishing the voltage at the gate of cascode transistor 7 at the desired value. Therefore, the voltage across the Miller frequency compensating capacitor in circuit 5 is substantially one-half the value which may exist across the Miller capacitor in circuit 1. However, because circuit 5 is operating in class A operation, a relatively significant amount of power is required which is disadvantageous.

Figure 3:
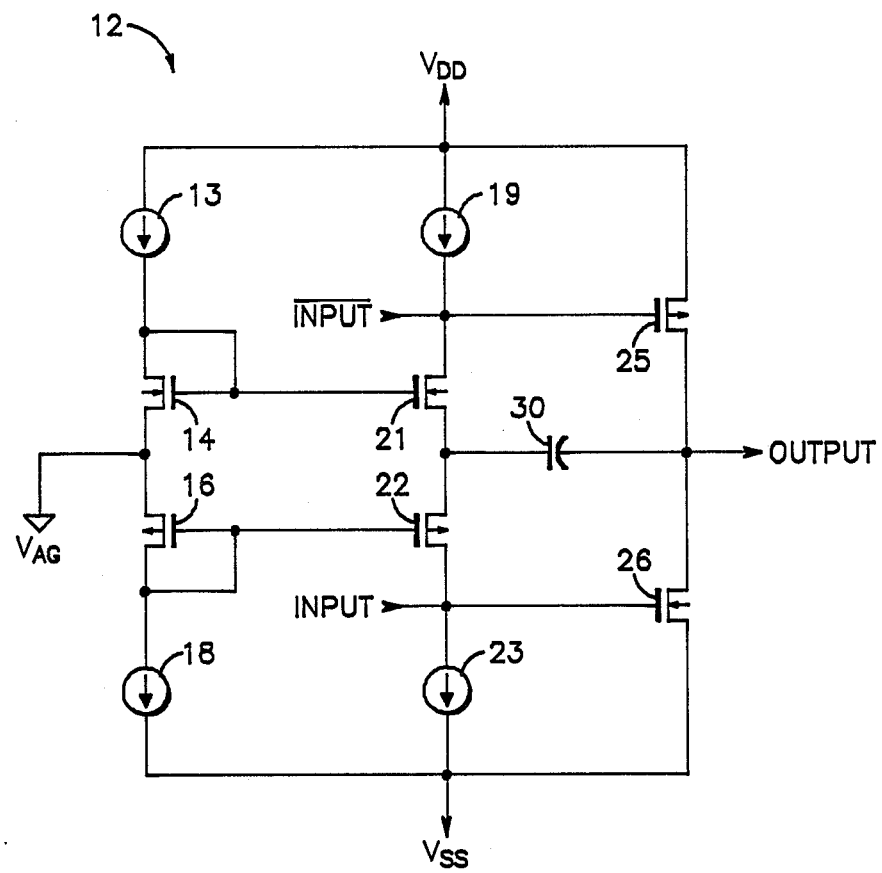
FIG. 3 illustrates in schematic diagram form a known class A cascode output driver circuit with feedback.

An extension of circuit 5 is shown in FIG. 3. A driver circuit 12 is provided having complementary symmetry wherein two cascode transistors are used. One of the cascode transistors is N-channel and the other cascode transistor is P-channel. As illustrated in FIG. 3, a first terminal of a current source 13 is connected to a first power supply voltage $V_{DD}$, and a second terminal of current source 13 is connected to a drain of an N-channel transistor 14. The drain of transistor 14 is also connected to a gate of transistor 14. A source of transistor 14 is connected to both a reference voltage terminal for receiving a reference voltage labeled "$V_{AG}$" and to a source of a P-channel transistor 16. Transistor 16 has a gate and a drain connected together and connected to a first terminal of a current sink 18. A second terminal of current sink 18 is connected to a second power supply voltage $V_{SS}$ which is less positive than $V_{DD}$. A first terminal of a current source 19 is connected to the first power supply voltage, and a second terminal of current source 19 is connected to a drain of an N-channel transistor 21 at a first input terminal for receiving a complemented input signal. A gate of transistor 21 is connected to the gate of transistor 14, and a source of transistor 21 is connected to a source of a P-channel transistor 22. A gate of transistor 22 is connected to the gate of transistor 16, and a drain of transistor 22 is connected to a first terminal of a current sink 23 at a second input terminal for receiving an input signal. A second terminal of current sink 23 is connected to the second power supply voltage $V_{SS}$. A source of a P-channel transistor 25 is connected to the first power supply voltage $V_{DD}$. A gate of transistor 25 is connected to the drain of transistor 21, and a drain of transistor 25 is connected to a drain of an N-channel transistor 26 for providing an output voltage. A gate of transistor 26 is connected to the drain of transistor 22, and a source of transistor 26 is connected to the second power supply voltage $V_{SS}$. A first electrode of a Miller frequency compensation capacitor 30 is connected to the sources of transistors 21 and 22, and a second electrode of capacitor 30 is connected to the drains of transistors 25 and 26. However, with two cascode transistors 21 and 22 continuously conducting bias current in a class A operation, a large amount of power dissipation also occurs in circuit 12.

Figure 4:
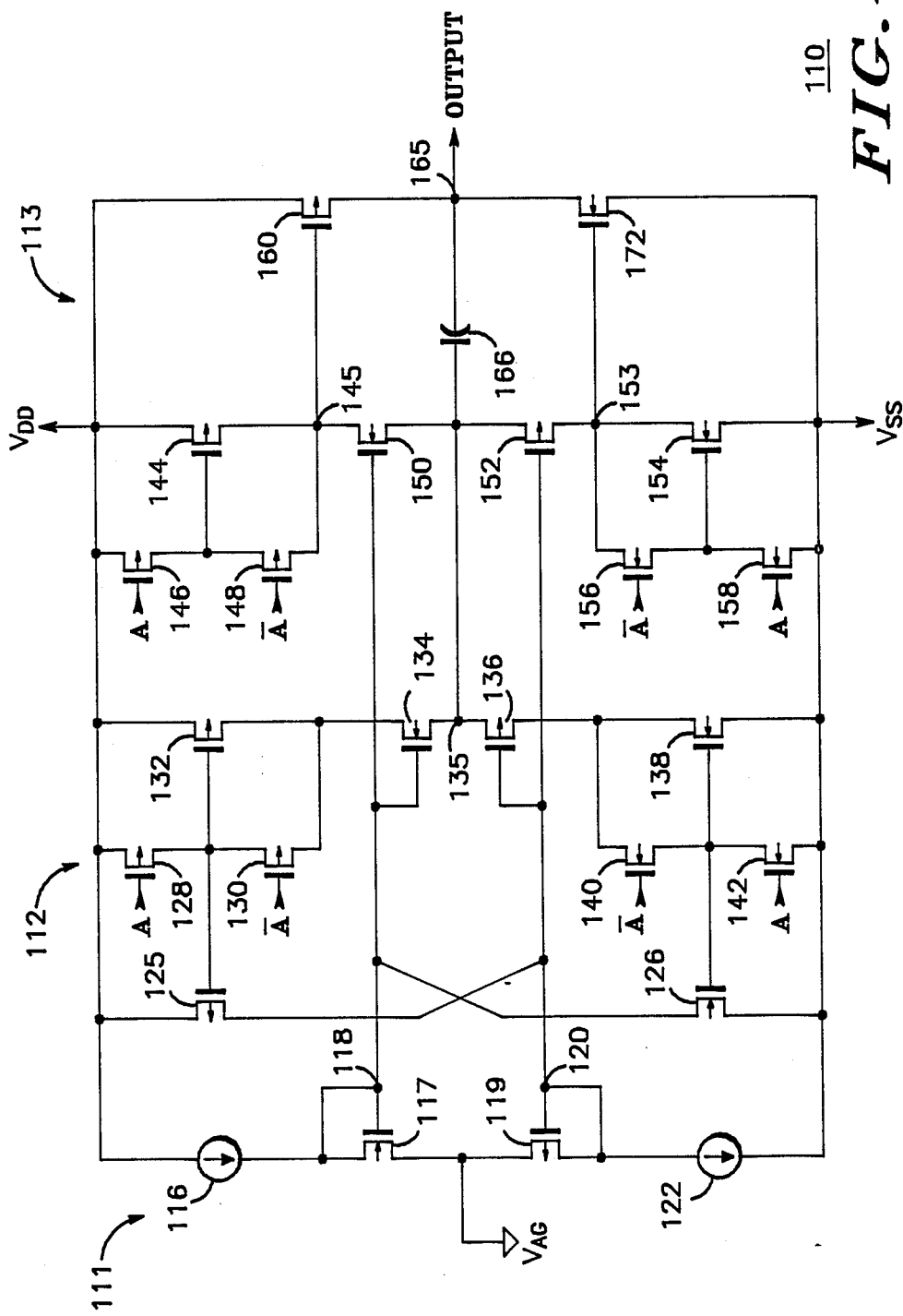
FIG. 4 illustrates in schematic diagram form a slew rate limited output circuit in accordance with the present invention.

Shown in FIG. 4 is a slew rate limited output circuit 110 in accordance with the present invention. Slew rate limited circuit 110 generally comprises a bias portion 111, an input portion 112 and an output portion 113. Bias portion 111 comprises a current source 116 having a first terminal connected to a power supply voltage labeled "$V_{DD}$". Current source 116 has a second terminal connected to a drain of a diode configured N-channel transistor 117. A gate of transistor 117 is connected to the drain thereof at a node 118. Transistor 117 has a source connected to an analog ground voltage terminal labeled "$V_{AG}$". A diode configured P-channel transistor 119 has a source connected to the analog ground voltage terminal, and a gate connected to a drain thereof at a node 120 and to a first terminal of a current sink 122. A second terminal of current sink 122 is connected to a power supply voltage labeled "$V_{SS}$". Supply voltage $V_{DD}$ is more positive than supply voltage $V_{SS}$, and analog ground $V_{AG}$ has a voltage substantially halfway between $V_{DD}$ and $V_{SS}$. A P-channel transistor 125 has a source connected to supply voltage $V_{DD}$, a gate, and a drain connected to node 120. An N-channel transistor 126 has a drain connected to node 118, a gate, and a source connected to supply voltage $V_{SS}$.

Input portion 112 comprises a P-channel transistor 128 having a source connected to supply voltage $V_{DD}$, a gate connected to a data signal labeled "A", and a drain connected to the gate of transistor 125. A P-channel transistor 130 has a source connected to the drain of transistor 128, a gate connected to a complement of data signal A, and a drain. Data signals A and Ā are complementary data input signals. A P-channel transistor 132 has a source connected to power supply $V_{DD}$, a gate connected to the drain of transistor 128, and a drain connected to both the drain of transistor 130 and to a drain of an N-channel transistor 134. A gate of transistor 134 is connected to the gate of transistor 117 at node 118. A source of transistor 134 is connected at a node 135 to a source of a P-channel transistor 136. A gate of transistor 136 is connected to the gate of transistor 119 at node 120, and a drain of transistor 136 is connected to a drain of both an N-channel transistor 138 and an N-channel transistor 140. A gate of transistor 138 is connected to both a source of transistor 140 and the gate of transistor 126. A source of transistor 138 is connected to supply voltage $V_{SS}$, and a gate of transistor 140 is connected to the complement of data signal A. A source of transistor 140 is connected to the gates of transistor 126 and 138 and to a drain of an N-channel transistor 142. A gate of transistor 142 is connected to data signal A, and a source of transistor 142 is connected to supply voltage $V_{SS}$. A source of a P-channel transistor 144 is connected to supply voltage $V_{DD}$. Transistor 144 has a gate, and also has a drain connected to a node 145. A P-channel transistor 146 has a source connected to supply voltage $V_{DD}$, a gate connected to data signal A, and a drain connected to the gate of transistor 144 and to a source of a P-channel transistor 148. A gate of transistor 148 is connected to the complement of data signal A, and a drain of transistor 148 is connected to a drain of an N-channel transistor 150 at a node 145. A gate of transistor 150 is connected to the gate of transistor 117 at node 118, and a source of transistor 150 is connected to the source of transistors 134 and 136 and to a source of a P-channel transistor 152 at node 135. A gate of transistor 152 is connected to the gate of transistor 119 at node 120, and a drain of transistor 152 is connected at a node 153 to a drain of an N-channel transistor 154. Transistor 154 has a gate, and has a source connected to supply voltage $V_{SS}$. An N-channel transistor 156 has a drain connected to the drain of transistor 154 at node 153, and has a gate connected to the complement of data signal A. A source of transistor 156 is connected to both the gate of transistor 154 and to a drain of an N-channel transistor 158. A gate of transistor 158 is connected to data signal A. A source of transistor 158 is connected to supply voltage $V_{SS}$.

Output portion 113 comprises a P-channel transistor 160 having a source connected to supply voltage VDD, a gate connected to the drain of transistor 148 at node 145, and a drain connected to the source of a P-channel transistor 162. A gate of transistor 162 is connected to an output terminal 165. A first electrode of a capacitor 166 is also connected to output terminal 165. A second electrode of capacitor 166 is connected to the sources of transistors 134, 136, 150 and 152 at node 135. A drain of an N-channel transistor 172 is connected to output terminal 165. A gate of transistor 172 is connected to the drains of transistors 152 and 154 at node 153, and a source of transistor 172 is connected to $V_{SS}$.

In operation, the voltage across capacitor 166 is minimized by never being allowed to exceed the magnitude of $V_{DD}$ or $V_{SS}$. The voltage is restricted from exceeding the magnitude of $V_{DD}$ or $V_{SS}$ by maintaining node 135 at $V_{AG}$. Node 135 is maintained at $V_{AG}$ by the joint operation of transistors 117, 119, 150 and 152. Transistors 117, 134 and 150 have the gates thereof sized to be a known ratio of gate width, as are the gate widths of transistors 119, 136 and 152. Consequently, the gate-to-source voltage, $V_{GS}$, of each of transistors 134 and 150 is the same as the gate-to-source voltage of transistor 117. Therefore, node 135 must assume the same voltage potential as the source of transistor 117 which is $V_{AG}$. Transistors 150 and 152 function as a source follower from the point of view of establishing a fixed D.C. bias at node 135. The output signal at output terminal 165 varies from $V_{DD}$ to $V_{SS}$. However, the output signal will vary or slew at a rate determined by the current thru capacitor 166 divided by the capacitance of capacitor 166 measured in volts per second. The current thru capacitor 166 is provided by either transistors 150 and 134 or by transistors 152 and 136. Since the capacitance of capacitor 166 is a fixed value and the voltage at node 135 remains fixed at $V_{AG}$, by controlling the current thru capacitor 166 the output slew rate can be controlled at a predetermined rate when the output signal transitions between $V_{DD}$ and $V_{SS}$. Node 135 functions as a feedback input for current to be fed back from output terminal 165 to transistors 136 and 152. By clamping the second electrode of capacitor 166 at node 135 to $V_{AG}$, voltage across capacitor 166 is limited to the magnitude of either $V_{DD}$ or $V_{SS}$ thereby protecting capacitor 166 from excessively high voltage stress.

In order to control the output slew rate at a predetermined rate by controlling the current thru capacitor 166 at a predetermined value, the current thru transistors 150 and 152 is controlled in response to the output signal. The voltages at nodes 118 and 120 function as a bias voltage for transistors 150 and 152, respectively. Whether the output signal slews from $V_{DD}$ to $V_{SS}$ or vice versa is dependent upon the logic state of the input data signal A. Assume initially that the output signal at output terminal 165 is at $V_{DD}$ and that the input data signal A suddenly transitions to cause the output signal to change to $V_{SS}$. In order to cause this circuit operation, input data signal A must transition from a logic low to a logic high signal level. Under this input condition, transistors 128, 140, 146 and 156 are nonconductive and transistors 130, 142, 148 and 158 are conductive. Also, transistors 125, 132 and 144 are conductive and transistors 126, 138 and 154 are nonconductive. Transistors 134 and 136 and transistors 150 and 152 are initially conductive due to conducting a mirrored current from transistors 117 and 119. When data signal A is at a logic one or high level, transistor 144 becomes configured as a diode which pulls node 145 from an initial voltage of approximately $V_{AG}$ up to a gate-to-source voltage drop, $V_{GS}$, below $V_{DD}$. Node 153 is initially at approximately $V_{SS}$, but begins to rise in voltage potential because of the conductive path to $V_{DD}$ via transistors 144, 150 and 152. The current in transistor 144 is mirrored by transistor 160 to provide a relatively small pull-up bias at output terminal 165. However, as node 153 rises in voltage potential, transistor 172 becomes conductive and output load current is conducted via transistor 172 to $V_{SS}$. Therefore, output terminal 165 begins to drop in voltage potential.

As the output voltage at output terminal 165 begins to drop, a current thru capacitor 166 is fed back to node 135 in a polarity so as to conduct current thru transistors 134 and 150 and away from transistors 136 and 152. Therefore, current thru transistors 134 and 132 is mirrored via transistor 125 to pull up node 120 and slightly bias off transistor 152. Also, the conduction of current thru transistor 150 and away from transistor 152 tends to slightly bias transistor 152 off thereby reducing the current to node 153. By regulating the current to node 153 in response to the current which is fed back thru capacitor 166, the output voltage slew rate at output terminal 165 is controlled. Therefore, output terminal 165 slews from $V_{DD}$ to $V_{SS}$ at a predetermined slew rate in response to the change in logic state of input signal A. Node 135 remains at approximately $V_{AG}$ and node 153 remains at approximately $V_{AG}$ after transitioning.

In the illustrated form, transistors 134 and 150 and transistors 136 and 152 are equally sized and supply an equal amount of current to node 135. Both the amount of current flowing at node 135 and the capacitive value of capacitor 166 determine the slew rate of the output voltage. The amount of current that can flow at node 135 is determined by the ratio of N-channel transistors 134 and 150 to N-channel mirror transistor 117 and also the ratio of P-channel transistors 136 and 152 to P-channel mirror transistor 119. Additionally, the current at node 135 is determined by the value of bias currents provided by current source 116 and current sink 122. The value of capacitor 166 is fixed by certain physical geometric sizing and process parameters. Therefore, the output signal slew rate is restricted to the predetermined rate.

In the illustrated form, circuit 110 has complete complementary symmetry in the sense that each P-channel transistor has a corresponding matching N-channel transistor which performs the same function but in opposing polarity at the opposite polarity power supply. Consequently, if the output voltage transitions from $V_{SS}$ to $V_{DD}$, the circuit operation of slew rate limited output circuit 110 is analogous to the previously described operation. The input data signal A must change logic level from a high logic level to a low logic level which makes transistors 130, 142, 148 and 158 nonconductive and transistors 128, 140, 146 and 156 conductive. Transistors 125, 132 and 144 are therefore nonconductive and transistors 126, 138 and 154 are conductive.

Node 153 which provides a control signal to transistor 172 discharges to a voltage which makes transistor 172 conduct a relatively small bias current for pulling down output terminal 165. Node 145 which provides a control signal to transistor 160 discharges to a voltage level which makes transistor 160 function as a current source pull-up device. The slew rate is again controlled by the amount of current conducted by capacitor 166 which equals the amount of current sourced by transistors 136 and 152. If the rate becomes too rapid, the current exceeds the predetermined amount in transistors 152 and 136. Transistor 126 will also start to conduct more current which lowers the voltage level at node 118 and reduces the current conducted by transistor 150. The current sourced by capacitor 166 and transistors 136 and 152 into transistors 134 and 150 is limited which limits the rate of discharge of node 145. Therefore, the output slew rate at output terminal 165 is limited.

In the illustrated form, output circuit 110 uses very little D.C. power. When no output loading is presented at output terminal 165, only a small amount of D.C. power is consumed by circuit 110. Further, the only D.C. power which is consumed is in the bias portion 111 wherein transistors 116, 117, 119 and 122 conduct a D.C. current. No other transistors in output circuit 110 conduct D.C. current between $V_{DD}$ and $V_{SS}$ in this operational mode. The reason no D.C. power is consumed is because all of the slew rate feedback control circuitry is operated in what is conventionally referred to as class B operation. That is to say, any particular transistor in circuit 110 is conductive only for one half cycle of data signal A with the exception of transistors 117 and 119, current source 116 and current sink 122. Therefore, each transistor has only a one hundred eighty degree conduction angle of the data signal A. Additionally, in input portion 112 there are no continuous D.C. paths between the power supply terminals $V_{DD}$ and $V_{SS}$, thereby eliminating any extra D.C. power dissipation.

It should be noted that circuit 110 may be implemented in other forms without using transistors 125, 126, 128, 130, 132, 134, 136, 138, 140 and 142. As explained above, when the output voltage begins to slew toward $V_{SS}$ and transistor 150 begins to conduct current, the current is shunted away from transistor 152 thru capacitor 166. Transistor 152 therefore begins being less conductive and node 153 stops rising in voltage level. Therefore, the output terminal 165 slews less quickly. Transistor 150 does not become nonconductive as quickly as desired. If transistors 150 and 152 do not have very high transconductances, small control voltages at nodes 118 and 120 are required to make one of transistors 150 and 152 conductive and the other transistor nonconductive. Because it is typically not practical to fabricate transistor 152 with a sufficiently high transconductance to turn off quickly, transistors 125, 126, 128, 130, 132, 134, 136, 138, 140 and 142 function to compensate for this fact. However, if transistors 150 and 152 are in fact high transconductance transistors, then transistors 125, 126, 128, 130, 132, 134, 136, 138, 140 and 142 are not necessary to provide more regulated control voltages required in the operation of circuit 110.

By now it should be apparent that an efficient slew rate limited output driver circuit has been provided. Although slew rate limiting is accomplished by use of a capacitor connected to an output terminal, the voltage across the capacitor is minimized and limited to never exceed the magnitude of only one of two power supply voltages used to power the circuit. By restricting the amount of voltage which may be placed across the capacitor, reliability of the capacitor is greatly enhanced especially when the capacitor is fabricated by thin oxide technology.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A low power output driver circuit having a slew rate limited output, comprising:

output means for providing a slewed output signal at an output terminal, said output terminal varying between first and second voltage potentials respectively coupled to first and second voltage terminals, said output signal varying in response to first and second control signals;

a capacitor having a first electrode coupled to the output terminal and having a second electrode;

input means coupled to the output means and to the second electrode of the capacitor, said input means receiving an input data signal and providing the first and second control signals, said input means maintaining the second electrode of the capacitor at a reference voltage between the first and second voltage potentials to restrict current conducted by the capacitor to a predetermined maximum value while conducting a feedback current thru the capacitor, said feedback current being used by the input means with the input data signal to form first and second control signals, said first and second control signals limiting voltage transistions at the output terminal when the output terminal transitions from the first voltage potential to the second voltage potential and from the second voltage potential to the first voltage potential; and bias means coupled to the input means for providing biasing of the input means.

2. The slew rate limited output driver circuit of claim 1 wherein said input means comprise:

a first transistor of a first conductivity type having a first current electrode coupled to a first voltage potential terminal, a control electrode, and a second current electrode;

a second transistor of a second conductivity type having a first current electrode, a control electrode, and a second current electrode coupled to a second voltage potential terminal;

a third transistor of the first conductivity type having a first current electrode coupled to the first voltage potential terminal, a control electrode coupled to the control electrode of the first transistor, and a second current electrode;

a fourth transistor of the first conductivity type having a first current electrode coupled to the first voltage potential terminal, a control electrode coupled to the input data signal, and a second current electrode coupled to the control electrode of the first and third transistors;

a fifth transistor of the first conductivity type having a first current electrode coupled to the second current electrode of the fourth transistor, a control electrode coupled to a complement of the input data signal, and a second current electrode coupled to the second current electrode of the third transistor;

a sixth transistor of the second conductivity type having a first current electrode coupled to the second current electrode of the third transistor, a control electrode coupled to the first current electrode of the second transistor, and a second current electrode coupled to the second electrode of the capacitor;

a seventh transistor of the first conductivity type having a first current electrode coupled to the second current electrode of the sixth transistor, a control electrode coupled to the second current electrode od the first transistor, and a second current electrode;

an eighth transistor of the second conductivity type having a first current electrode coupled to the second current electrode of the seventh transistor, a control electrode coupled to the control electrode of the second transistor, and a second current electrode coupled to the second voltage potential terminal;

a ninth transistor of the second conductivity type having a first current electrode coupled to the second current electrode of the seventh transistor, a control electrode coupled to the complement of the input data signal, and a second current electrode coupled to the control electrodes of the second and eighth transistors;

a tenth transistor of the second conductivity type having a first current electrode coupled to the second current electrode of the ninth transistor, a control electrode coupled to the input data signal, and a second current electrode coupled to the second voltage potential terminal;

an eleventh transistor of the first conductivity type having a first current electrode coupled to the first voltage potential terminal, a control electrode, and a second current electrode;

a twelfth transistor of the first conductivity type having a first current electrode coupled to the first voltage potential terminal, a control electrode coupled to the input data signal, and a second current electrode coupled to the control electrode of the eleventh transistor;

a thirteenth transistor of the first conductivity type having a first current electrode coupled to second current electrode of the twelfth transistor, a control electrode coupled to the complement of the input data signal, and a second current electrode coupled to the second current electrode of the eleventh transistor;

a fourteenth transistor of the second conductivity type having a first current electrode coupled to the second current electrode of the eleventh transistor, a control electrode coupled to the control electrode of the sixth transistor, and a second current electrode coupled to both the second current electrode of the sixth transistor and the second electrode of the capacitor;

a fifteenth transistor of the conductivity type having a first current electrode coupled to the second current electrode of the fourteenth transistor, a control electrode coupled to the control electrode of the seventh transistor, and a second current electrode;

a sixteenth transistor of the second conductivity type having a first current electrode coupled to the second current electrode of the fifteenth transistor a control electrode, and a second current electrode coupled to the second voltage potential terminal;

a seventeenth transistor of the second conductivity type having a first current electrode coupled to the first current electrode of the sixteenth transistor, a control electrode coupled to the complement of the input data signal, and a second current electrode coupled to the control electrode of the sixteenth transistor; and an eighteenth transistor of the second conductivity type having a first current electrode coupled to the second current electrode of the seventeenth transistor, a control electrode coupled to the input data signal, and a second current electrode coupled to the second voltage potential terminal.

3. The slew rate limited output driver circuit of claim 2 where said bias means further comprise:

a nineteenth transistor of the first conductivity type having a first current electrode coupled to the first voltage potential terminal, a control electrode for receiving a first bias signal, and a second current electrode;

a twentieth transistor of the second conductivity type having both a first current electrode and a control electrode connected together and coupled to the second current electrode of the nineteenth transistor, to the first current electrode of the second transistor and to the control electrodes of the sixth and fourteenth transistors, and having a second current electrode coupled to a reference voltage terminal;

a twenty-first transistor of the first conductivity type having a first current electrode coupled to the reference voltage terminal, and both a control electrode and a second current electrode connected together and coupled to the second current electrode of the first transistor and to the control electrodes of the seventh and fifteenth transistors;

a twenty-second transistor of the second conductivity type having a first current electrode coupled to the second current electrode of the twenty-first transistor, a control electrode for receiving a second bias signal, and a second current electrode coupled to the second voltage potential terminal.

4. A method of limiting voltage transistions across a slew rate limiting capacitor in a driver circuit providing a slew rate limited output signal and requiring first and second power supply voltages, comprising the steps of:

providing an output stage of the circuit having a slewed output signal at an output terminal which substantially varies between the first and second power supply voltages in response to an input signal;

coupling a first electrode of a capacitor to the output terminal for slew rate limiting the output signal proportional to a ratio of the capacitor's capacitive value and current conducted by the capacitor;

maintaining a second electrode of the capacitor at a reference voltage between the first and second power supply voltages to restrict current conducted by the capacitor to a predetermined maximum value while conducting a feedback current thru the capacitor, said feedback current being used by the circuit to form first and second control voltages which control the slew rate of the output signal.

5. The method of claim 4 wherein the reference voltage is substantially one-half between the first and second power supply voltages.

6. A low power output driver circuit having a slew rate limited output, comprising:

output means for providing a slewed output signal at an output terminal, said output terminal varying between first and second voltage potentials respectively coupled to first and second voltage terminals, said output signal varying in response to first and second control signals;

a capacitor having a first electrode coupled to the output terminal and having a second electrode;

input means coupled to the output means and to the second electrode of the capacitor, said input means receiving an input data signal and providing the first and second control signals, said input means constantly maintaining the second electrode of the capacitor at a fixed reference voltage between the first and second voltage potentials, said first and second control signals limiting voltage transitons at the output terminal when the output terminal transitions from the first voltage potential to the second voltage potential and from the second voltage potential to the first voltage potential; and bias means coupled to the input means for providing biasing of the input means.

* * * * *

UNITED STATES PATENT AND TRADEMARK OFFICE
CERTIFICATE OF CORRECTION

PATENT NO. : 4,857,863

DATED : August 15, 1989

INVENTOR(S) : Jeffrey D. Ganger and Roger A. Whatley

It is certified that error appears in the above-identified patent and that said Letters Patent is hereby corrected as shown below:

In claim 2, column 9, line 63 before "conductivity" insert --first--;

In claim 2, column 10, line 3, after "transistor" insert --,--.

Signed and Sealed this

Twenty-eighth Day of August, 1990

Attest:

HARRY F. MANBECK, JR.

Attesting Officer     Commissioner of Patents and Trademarks